(12) United States Patent
Burak et al.

(10) Patent No.: US 8,797,123 B2
(45) Date of Patent: Aug. 5, 2014

(54) DOUBLE FILM BULK ACOUSTIC RESONATOR HAVING ELECTRODE EDGE ALIGNMENTS PROVIDING IMPROVED QUALITY FACTOR OR ELECTROMECHANICAL COUPLING COEFFICIENT

(75) Inventors: Dariusz Burak, Fort Collins, CO (US); Chris Feng, Fort Collins, CO (US); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 310 days.

(21) Appl. No.: 13/232,213

(22) Filed: Sep. 14, 2011

(65) Prior Publication Data
US 2013/0063226 A1    Mar. 14, 2013

(51) Int. Cl.
H03H 9/02 (2006.01)
H03H 9/58 (2006.01)
H03H 9/13 (2006.01)
H03H 9/15 (2006.01)

(52) U.S. Cl.
CPC ............. *H03H 9/132* (2013.01); *H03H 9/585* (2013.01); *H03H 9/587* (2013.01)
USPC ......................................... 333/187; 333/191

(58) Field of Classification Search
USPC ............... 333/187, 188, 189, 191, 192
See application file for complete search history.

(56) References Cited

U.S. PATENT DOCUMENTS

| | | | |
|---|---|---|---|
| 5,382,930 A * | 1/1995 | Stokes et al. ................. | 333/191 |
| 5,587,620 A | 12/1996 | Ruby et al. | |
| 5,873,153 A | 2/1999 | Ruby et al. | |
| 6,060,818 A * | 5/2000 | Ruby et al. .................... | 310/363 |
| 6,107,721 A | 8/2000 | Lakin | |
| 6,150,703 A * | 11/2000 | Cushman et al. ............. | 257/415 |
| 6,297,713 B1 | 10/2001 | Kadota et al. | |
| 6,437,484 B1 * | 8/2002 | Nishimura et al. ........... | 310/324 |
| 6,507,983 B1 | 1/2003 | Ruby et al. | |
| 7,280,007 B2 | 10/2007 | Feng et al. | |
| 7,388,454 B2 | 6/2008 | Ruby et al. | |
| 7,548,139 B2 | 6/2009 | Park et al. | |
| 7,554,427 B2 * | 6/2009 | Matsumoto et al. .......... | 333/187 |
| 7,629,865 B2 | 12/2009 | Ruby | |
| 7,786,826 B2 | 8/2010 | Thalhammer et al. | |
| 7,889,024 B2 | 2/2011 | Bradley et al. | |
| 8,330,325 B1 * | 12/2012 | Burak et al. .................. | 310/320 |
| 2007/0205850 A1 | 9/2007 | Jamneala et al. | |
| 2009/0079514 A1 | 3/2009 | Jamneala et al. | |
| 2010/0107389 A1 | 5/2010 | Nessler et al. | |
| 2010/0327697 A1 | 12/2010 | Choy et al. | |
| 2010/0327994 A1 | 12/2010 | Choy et al. | |
| 2012/0218055 A1 | 8/2012 | Burak et al. | |
| 2012/0280767 A1 | 11/2012 | Burak et al. | |

FOREIGN PATENT DOCUMENTS

DE    102004053318 A1    11/2006

OTHER PUBLICATIONS

Co-pending U.S. Appl. No. 13/101,376, filed May 5, 2011.

* cited by examiner

*Primary Examiner* — Dean O Takaoka (57) ABSTRACT

An acoustic resonator comprises a substrate having a trench with lateral boundaries, a first electrode formed on the substrate over the trench and having lateral edges that are laterally offset from the lateral boundaries of the trench by a first distance, a first piezoelectric layer formed on the first electrode, a second electrode formed on the first piezoelectric layer and having edges that are laterally aligned inside the lateral boundaries of the trench, a second piezoelectric layer located on the second electrode, and a third electrode located on the second piezoelectric layer and having edges that are laterally offset from the edges of the second electrode.

19 Claims, 8 Drawing Sheets

Figure 1:
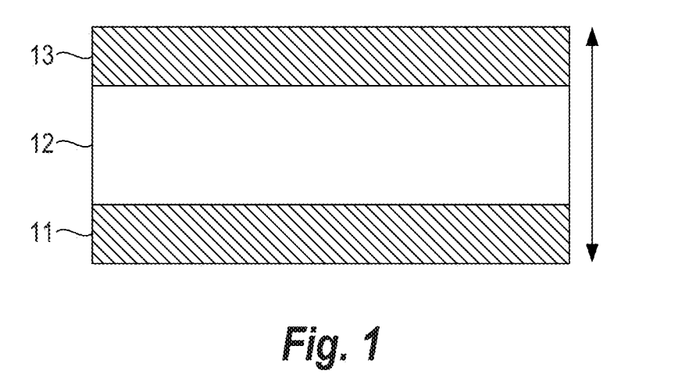
FIG. 1 is a cross-sectional view of an example acoustic resonator.

Fig. 11 ated in piezoelectric layer 12, and the acoustic wave propagates through acoustic resonator 10. For example, in some implementations, the acoustic wave propagates in parallel with the electric field as a longitudinal wave, or along the mechanical interfaces of acoustic resonator 10 as a lateral wave.

DOUBLE FILM BULK ACOUSTIC RESONATOR HAVING ELECTRODE EDGE ALIGNMENTS PROVIDING IMPROVED QUALITY FACTOR OR ELECTROMECHANICAL COUPLING COEFFICIENT

BACKGROUND

There is an increasing demand for mobile communication devices capable of operating across a variety of different frequency bands. Common examples of such devices include cellular phones that operate in multiple frequency bands. These devices typically employ transmit and receive filters to tune each transmit and receive frequency band.

Various types of acoustic resonators can be used to construct filters for appropriate applications. Examples of these acoustic resonators include bulk acoustic wave (BAW) resonators such as thin film bulk acoustic resonators (FBARs) and solid mounted resonators (SMRs). BAW resonators can also be employed to construct oscillators such as tunable voltage controlled oscillators (VCOs) for some applications.

A typical implementation of an acoustic resonator comprises a piezoelectric layer (e.g., a layer of piezoelectric material) disposed between two electrically-conductive (e.g., metal) electrodes.

FIG. 1 is a cross-sectional view of an acoustic resonator 10 comprising a piezoelectric layer 12 disposed between a bottom electrode 11 and a top electrode 13. The designations top electrode and bottom electrode are for convenience of explanation, and they do not represent any limitation with regard to the spatial arrangement, positioning, or orientation of acoustic resonator 10.

During operation, an electric field is applied between first electrode 11 and second electrode 13 of acoustic resonator 10. In response to this electrical field, the reciprocal or inverse piezoelectric effect causes acoustic resonator 10 to mechanically expand or contract depending on the polarization of the piezoelectric material, as indicated by an arrow in FIG. 1. As the electrical field varies over time, an acoustic wave is generated in piezoelectric layer 12, and the acoustic wave propagates through acoustic resonator 10. For example, in some implementations, the acoustic wave propagates in parallel with the electric field as a longitudinal wave, or along the mechanical interfaces of acoustic resonator 10 as a lateral wave.

For longitudinal waves, where a thickness d of piezoelectric layer 12 and of the top and bottom electrodes equals an odd (1, 3, 5 . . . ) integer multiple of half the wavelength λ of the acoustic waves, resonance states and/or acoustic resonance vibrations will occur. Because each acoustic material has a different propagation velocity for the acoustic wave, the fundamental resonance frequency, i.e. the lowest resonance frequency $F_{RES}$, will then be inversely proportional to a weighted sum of all thicknesses of the resonator layers.

The piezoelectric properties and, thus, also the resonance properties of an acoustic resonator depend on various factors, e.g. on the piezoelectric material, the production method, the polarization impressed upon the piezoelectric material during manufacturing, and the size of the crystals.

Figure 2:
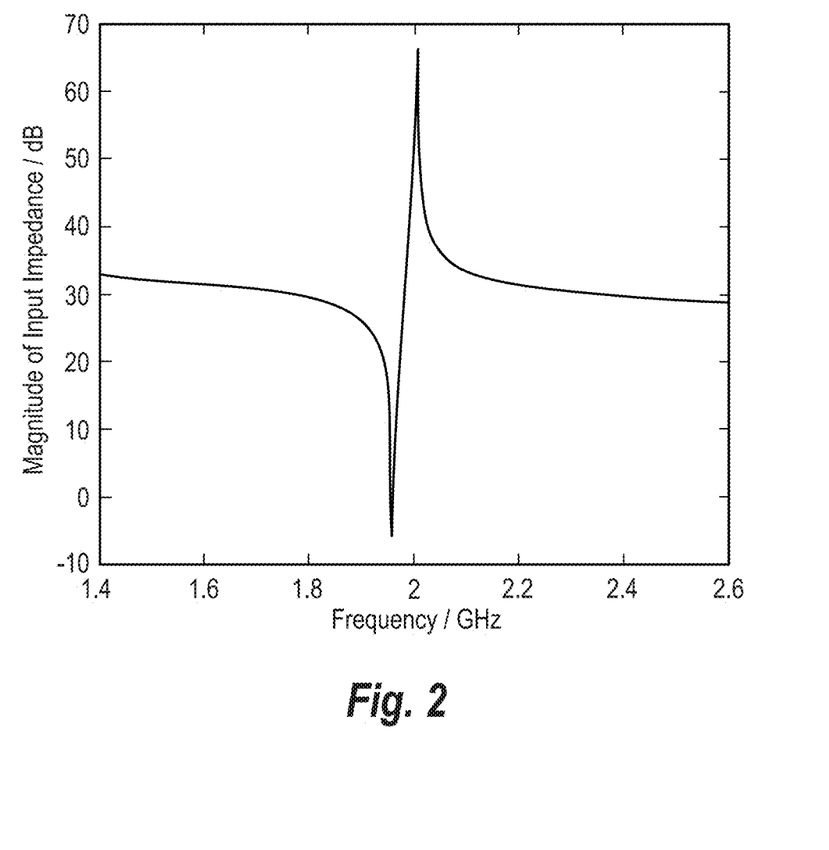
FIG. 2 illustrates an example input impedance response versus frequency for an acoustic resonator.

FIG. 2 is a graph illustrating a logarithmic input impedance response versus frequency for an example acoustic resonator. As shown in FIG. 2, the input impedance of the example acoustic resonator exhibits a sharp negative-going peak from a series resonance at a lower frequency $f_S$, and a sharp positive-going peak from a parallel resonance at a higher frequency $f_P$.

Figure 3A:
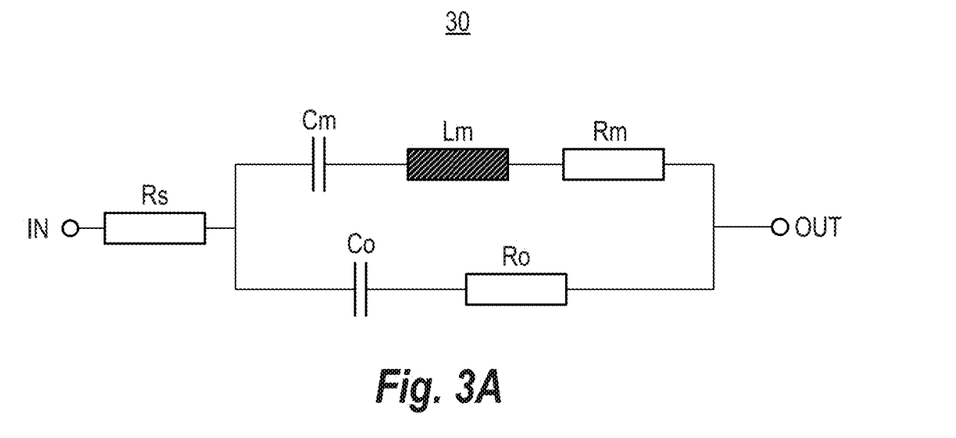
FIG. 3A shows an electrical model of a BAW such as an FBAR.
Figure 3B:
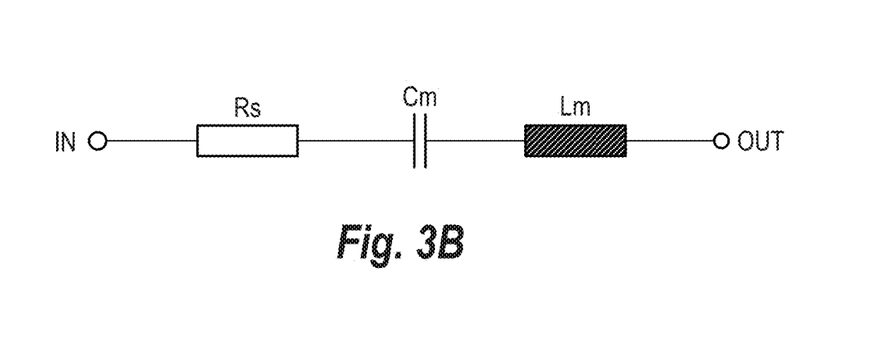
FIG. 3B shows a simplified model of a RAW resonator at series resonance.
Figure 3C:
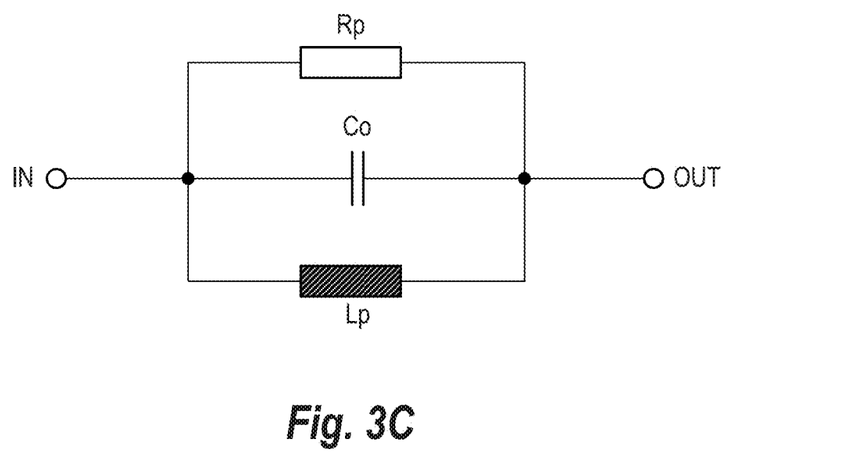
FIG. 3C shows a simplified model of a BAW resonator at parallel resonance.

FIGS. 3A through 3C are circuit diagrams illustrating electrical models of a BAW resonator such as an FBAR. The model of FIG. 3A is a modified Butterworth-Van Dyke model (MBVD) model. The frequency response of this model is a bandpass response, with frequencies below the passband being attenuated by capacitances Cm and Co, and with frequencies above the passband being attenuated by an inductance Lm. As shown in FIG. 3B, at series resistance, the BAW resonator can be modeled by a series-resonant combination of inductance Lm and capacitance Cm in series with a parasitic resistance Rs. As shown in FIG. 3C, at parallel resonance, the BAW resonator can be modeled by a parallel-resonant combination of inductance Lm and capacitance Co in parallel with a parasitic resistance Rp. Resistances Rs and Rp represent various heat losses and acoustic losses within the acoustic resonator.

An acoustic resonator can be employed in various types of electrical filters, such as radio frequency (RF) filters or a microwave filters. In addition, acoustic resonators can be combined in various ways to produce a variety of filter configurations. The performance of an RF or microwave filter constructed with an acoustic resonator depends on the performance of the acoustic resonator, which can be expressed in terms of the resonator's parallel resistance Rp, series resistance Rs and its electromechanical coupling coefficient $kt^2$. Referring to FIG. 2, the series resistance Rs is the smallest value of magnitude of input impedance, and series resonance frequency Fs is a frequency at which that minimum occurs. The parallel resistance Rp is the largest value of magnitude of input impedance, and parallel resonance frequency Fp is a frequency at which that maximum occurs. The electromechanical coupling coefficient $kt^2$ is a normalized difference between parallel and series resonance frequencies Fp and Fs and is typically expressed in percent values (%). In general, devices with higher Rp or $kt^2$ and lower Rs are considered to have superior performance than devices with higher Rs or lower Rp or lower $kt^2$. Thus, other things being equal, it is desirable to provide a filter with an acoustic resonator having a higher Rp or $kt^2$ and lower Rs.

An acoustic resonator can also be employed in an oscillator. Where an acoustic resonator is employed in an oscillator, the performance of the oscillator (e.g., phase noise) is affected by the Rp or $kt^2$ of the acoustic resonator. Moreover, as with filters, it is also desirable to provide an oscillator with an acoustic resonator having a higher Rp or $kt^2$ and lower Rs.

Unfortunately, many design choices that increase the Rp of an acoustic resonator tend to decrease the $kt^2$ of the acoustic resonator, and vice versa. In other words, there is generally a tradeoff between Rp and $kt^2$. Consequently, applications requiring high Rp may be required to sacrifice $kt^2$, and applications requiring a high $kt^2$ may be required to sacrifice Rp.

What is needed, therefore, are acoustic resonator structures that can provide appropriate values of Rp and electromechanical coupling coefficient $kt^2$ according to the demands of different applications.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The described embodiments relate generally to DBAR devices and related technologies such as FBAR devices. Certain details of DBAR and FBAR devices, materials thereof, and their methods of fabrication may be found in one or more of the following commonly owned U.S. Patents, Patent Application Publications, and Patent Applications: U.S. Pat. No. 6,107,721, to Lakin; U.S. Pat. Nos. 5,587,620, 5,873,153 and 6,507,983 to Ruby, et al.; U.S. Pat. No. 7,629,865 to Ruby; U.S. Pat. No. 7,280,007 to Feng, et al.; U.S. Patent Application Publication 20070205850 to Jamneala, et al.; U.S. Pat. No. 7,388,454 to Ruby, et al; U.S. Patent Application Publication 2010032769 to Choy, et al.; and U.S. Patent Application Publication 20100327994 to Choy, et al. Examples of stacked bulk acoustic resonators, as well as their materials and methods of fabrication, may be found in U.S. Pat. No. 7,889,024 to Bradley et al.

The disclosures of these patents and patent applications are specifically incorporated herein by reference. The components, materials and method of fabrication described in these patents and patent applications are representative, and other methods of fabrication and materials within the purview of one of ordinary skill in the art are contemplated.

In the described embodiments, DBAR devices are formed with electrode edge alignments that can enhance the devices' parallel resistance Rp or electromechanical coupling coefficient $kt^2$. For example, in some embodiments, a DBAR device has bottom, middle, and top electrodes with edges aligned in a "Δ" configuration or a "∇" configuration to enhance the device's parallel resistance Rp. In each of these configurations, the bottom electrode is formed over a substrate, and the middle and top electrodes are formed over the first electrode. In the Δ configuration, edges of the bottom electrode extend beyond edges of the middle electrode, and the edges of the middle electrode extend beyond edges of the top electrode. This forms a pyramid shape where the electrodes become narrower as their height above the substrate increases. Meanwhile, in the ∇ configuration, the edges of the top electrode extend beyond the edges of the middle electrode, and the edges of the middle electrode extend beyond the edges of the bottom electrode. This forms an inverse pyramid shape where the electrodes become wider as their height above the substrate increases.

In other embodiments, a DBAR device has bottom, middle, and top electrodes with edges aligned in a "Ξ" configuration or a "Θ" configuration to enhance the device's electromechanical coupling coefficient $kt^2$. In each of these configurations, the bottom electrode is formed over a substrate, and the middle and top electrodes are formed over the first electrode. In the Ξ configuration, edges of the top and bottom electrodes extend beyond edges of the middle electrode. In other words, they are "cut" within lateral boundaries defined by the edges of the top and bottom electrodes. In the Θ configuration, edges of the middle electrode extend beyond edges of the bottom and top electrodes. In other words, they are "cut" outside of lateral boundaries defined by the edges of the top and bottom electrodes.

The described embodiments find application in a variety of contexts or devices. For example, they can be employed in a variety of configurations for RF and microwave devices such as filters and oscillators operating in a variety of frequency bands. For use in mobile communication devices, one particular example of a frequency band of interest is the 850 MHz "cellular band." In general, the size of a BAW resonator increases with decreasing frequency such that a BAW resonator for the 850 MHz band will be substantially larger than a similar a BAW resonator for the 2 GHz personal communication services (PCS) band. Meanwhile, there is a continual desire to make all components of a mobile communication device smaller. To this end, it may be conceptually imagined that a BAW resonator having a relatively large size may be cut in half, and the two halves—each of which may be considered to be a smaller acoustic resonator—may be stacked upon one another. An example of such a stacked device is a Double Bulk Acoustic Resonator (DBAR).

Figure 4A:
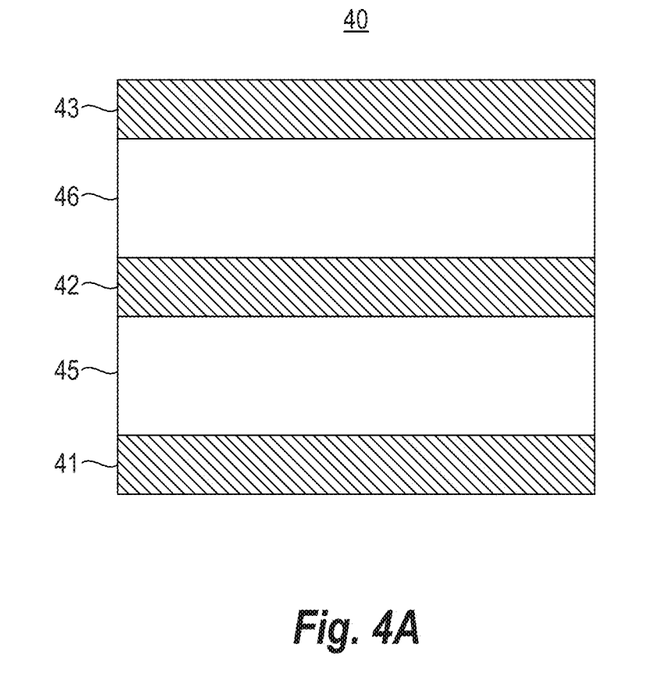
FIG. 4A is a cross-sectional view of a double thin film bulk acoustic resonator (DBAR) acoustic stack according to an example embodiment.
Figure 4B:
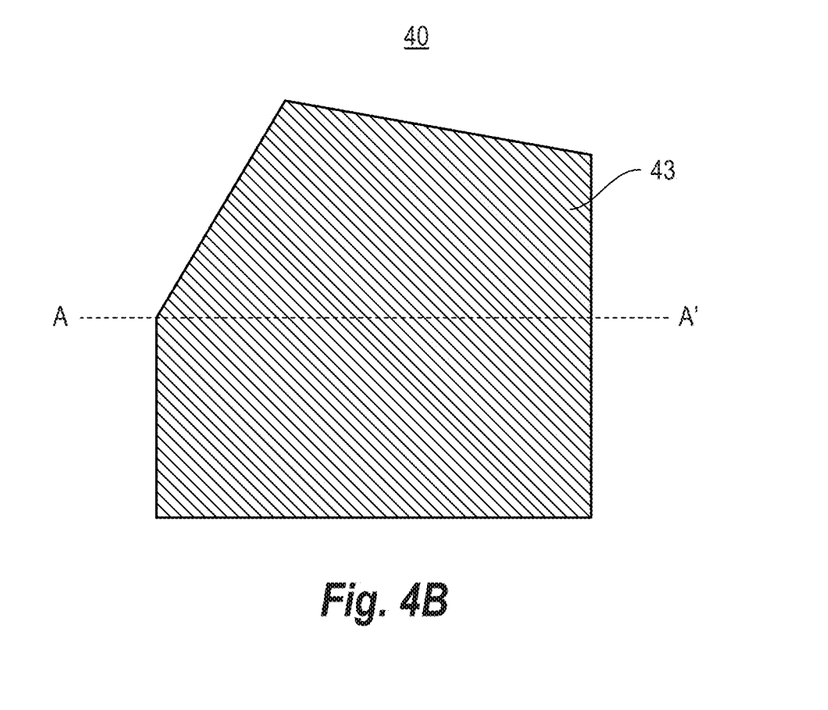
FIG. 4B is a top view of the DBAR of FIG. 4A according to an example embodiment.

FIGS. 4A and 4B are diagrams of a DBAR according to an example embodiment. More specifically, FIG. 4A is a cross-sectional view of a DBAR acoustic stack according to an example embodiment, and FIG. 4B is a top view of the DBAR shown in FIG. 4A according to an example embodiment. A line A-A' in FIG. 4B illustrates the location of the cross-sectional view in FIG. 4A.

Referring to FIG. 4A, DBAR 40 comprises a first electrode 41, a first piezoelectric layer 45, a second electrode 42, a second piezoelectric layer 46, and a third electrode 43, assembled in a stacked structure. First, second and third electrodes 41, 42 and 43 are formed of electrically conductive materials, such as tungsten (W), molybdenum (Mo) or copper (Cu), and first and second piezoelectric layers 45 and 46 are formed of a thin film of piezoelectric material, such as zinc oxide (ZnO), aluminum nitride (AlN) or lead zirconium titanate (PZT), although other materials can be incorporated without departing from the scope of the present teachings.

In some configurations, first and third electrodes 41 and 43 are tied to a common electrical ground (not shown), and second electrode 42 is connected to a time-varying voltage source (not shown). Alternatively, first and third electrodes 41 and 43 can be connected to the time-varying voltage source while second electrode 42 is tied to a common electrical ground.

First, second and third electrodes 41, 42 and 43 can be formed of the same or different materials from one another, and first and second piezoelectric layers 45 and 46 can also be formed of the same or different materials from one another. First, second and third electrodes 41, 42 and 43 can have the same or different thicknesses from one another, and first and second piezoelectric layers 45 and 46 can have the same or different thicknesses from one another. For example, second electrode 42 can be approximately twice as thick as first and third electrodes 41 and 43, as described for example in U.S. Pat. No. 7,889,024 to Bradley et al. The respective thicknesses of the first, second and third electrodes 41, 42 and 43, and first and second piezoelectric layers 45 and 46, can vary to provide unique benefits for particular situations or to meet application specific design requirements. Examples of various alternative electrode thicknesses are disclosed in U.S. patent application Ser. No. 13/101,376 filed on May 5, 2011 by Burak et al., the disclosure of which is hereby incorporated by reference.

Referring to FIG. 4B, DBAR 40 has the shape of an apodized pentagon. In other words, it is formed with five edges of different lengths. In alternative embodiments, DBAR 40 can be formed with fewer or additional edges, e.g., six or seven edges.

One edge of DBAR 40 is generally used to connect first through third electrodes 41, 42 and 43 to input/output terminals. This edge is referred to as a connecting edge, while other edges are referred to as non-connecting edges. In the connecting edge, first through third electrodes 41, 42, and 43 can extend farther to one side compared to non-connecting edges. For instance, these electrodes could extend to the left in FIG. 4A to connect with input/output terminals.

Referring again to FIG. 4A, the stacked structure of DBAR 40 enables a reduction in area as compared to acoustic resonator 10 of FIG. 1. However, this reduction in area comes with a cost of increasing acoustic energy losses due to the larger number of lateral modes allowed by such thicker stacks as compared to three-layer stack of FBAR 10 in FIG. 1. Consequently, the Rp and $kt^2$ of DBAR 40 are typically lower than those of the "equivalent" acoustic resonator 10. For instance, some simulations have estimated the Rp for acoustic resonator 10 at approximately 4 kΩ, while the Rp for the "equivalent" DBAR 40 is only approximately 2.8 kΩ. In these simulations, the Rp for DBAR 40 is only approximately 75% of the Rp of the "equivalent" acoustic resonator 10.

The Rp and $kt^2$ a DBAR can be improved (i.e., these values can be increased) by laterally aligning edges of first through third electrodes 41 through 43 in ways that suppress excitation of spurious lateral modes, as described below with reference to FIGS. 5 through 10.

Figure 5:
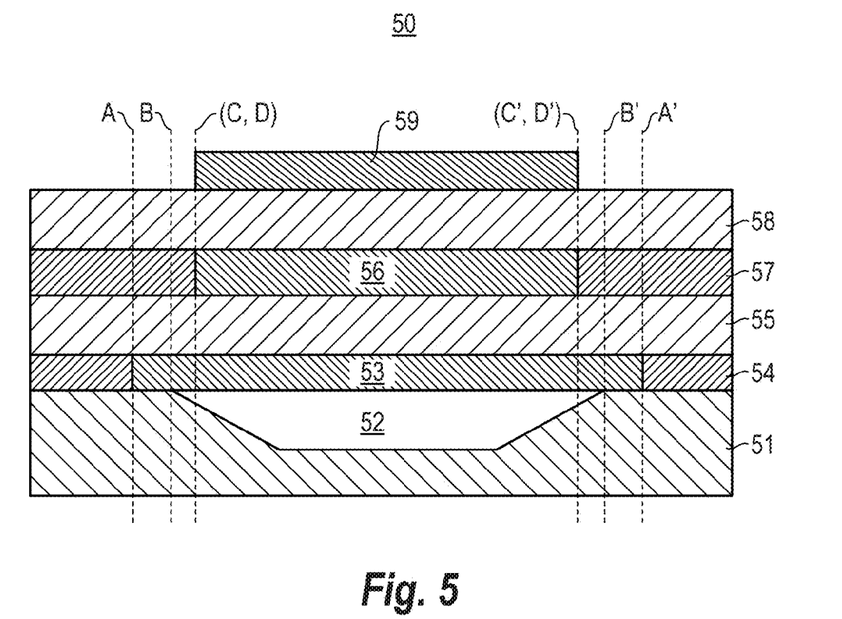
FIG. 5 is a cross-sectional view of a DBAR having electrode edges that are aligned with each other according to an example embodiment.

FIGS. 5 through 9 are cross-sectional views of a DBAR 50 having different electrode edge alignments according to example embodiments. FIG. 5 is a cross-sectional view of DBAR 50 with middle and top electrodes that are laterally aligned and serves as a baseline reference for comparison with other embodiments. FIGS. 6 through 9 are cross-sectional views of DBAR 50 with various alternative electrode edge alignments designed to improve Rp or $kt^2$.

Although not shown in the drawings, DBAR 50 is typically formed with a multi-edge structure such as the apodized pentagon of FIG. 4B or a six or seven sided polygon. Moreover, DBAR 50 typically has one edge designated as a connecting edge while other edges are designated as non-connecting edges. The cross-sectional views shown in FIGS. 5 through 9 are non-connecting edges, and the connecting edges typically differ from these views by laterally extending bottom, middle, and top electrodes in one direction, e.g., in a left direction of the depicted devices. In this manner, the electrodes on the connecting edge can be connected with input/output terminals of DBAR 50.

Referring to FIG. 5, DBAR 50 comprises a substrate 51, a bottom electrode 53, a first piezoelectric layer 55, a middle electrode 56, a second piezoelectric layer 58, and a top electrode 59. The electrodes and piezoelectric layers in FIG. 5 form an acoustic stack of DBAR 50, and they can be formed of materials similar to the electrodes and piezoelectric layers of FIGS. 4A and 4B.

Substrate 51 has a trench 52, which can include an air gap or an acoustic reflector such as a Bragg mirror. The air gap or acoustic reflector prevents substrate 51 from absorbing mechanical energy from the acoustic stack as it vibrates. In other words, the air gap or acoustic reflector allows the active region of the acoustic stack to vibrate with relative freedom. The air gap is typically formed by depositing a sacrificial layer in trench 52 prior to forming bottom electrode 53, and then removing the sacrificial layer subsequent to forming top electrode 59. Thus, bottom electrode 53 can be suspended above the air gap.

First and second planarization layers 54 and 57 are located at outer boundaries of bottom and middle electrodes 53 and 56. These planarization layers are can be formed of non-etchable borosilicate glass (NEBSG), for example, and they are generally used to facilitate the manufacture of bottom and middle electrodes 53 and 56 while providing structural stability and acoustic confinement to DBAR 50.

In FIGS. 5 through 9, four sets of lines A/A', B/B', C/C', and D/D' indicate lateral boundaries or edges of different parts of DBAR 50. More specifically, lines A/A' indicate edges of bottom electrode 53, lines B/B' indicate lateral boundaries of trench 52, lines C/C' indicate edges of middle electrode 56, and lines D/D' indicate boundaries of top electrode 59. In addition, an innermost set of lines indicate boundaries of an active region of DBAR 50, where the active region is defined by a lateral overlap between bottom, middle and top electrodes 53, 56, and 59. For example, in FIG. 5, lines D/D' indicate the boundaries of the active region of DBAR 50, and in FIG. 7, lines A/A' indicate the boundaries of the active region of DBAR 50.

Referring still to FIG. 5, middle and top electrodes 56 and 59 are laterally aligned with each other, so lines C/C' and D/D' coincide, and bottom electrode 53 extends onto substrate 51 to provide structural stability and for convenience in manufacturing. Middle and top electrodes 56 and 59 are aligned in order to make DBAR 50 relatively symmetrical, and they are confined within the boundaries of trench 52 so the active region of DBAR 50 is located above trench 52. The confinement of middle and top electrodes 56 and 59 within the boundaries of trench 52 prevents the active region from losing energy into substrate 51 as it vibrates. A typical distance between the edges of trench 52 and middle and top electrodes 56 and 59 is approximately one-half percent and one percent of the average width of trench 52. For example, where trench 52 is 200 microns wide on average, the edges of middle electrode 56 can be located two microns from the boundaries of trench 52. Because DBAR 50 is typically apodized, the width of trench 52 may vary on different sides of the device.

During operation of DBAR 50, acoustic waves are excited though the electric field induced motion of first and second piezoelectric layers 55 and 58. In an ideal laterally infinite resonator, all mechanical motion would be converted back to the electric field yielding an infinite Q-factor of the resonator. However, presence of the edges of the bottom, middle and top electrodes 53, 56 and 59 causes some of that electrically induced motion to scatter, thus transferring part of the mechanical energy into unwanted modes (for example, shear and flexural, or lowest order thickness-extensional) which cannot be converted back to the charges that are being picked up by the electrodes. Moreover, these unwanted waves can actually propagate away from the device region defined as a region between vertical lines A and A'. Such scattering mechanisms tend to lower the performance of DBAR 50. However, upon reflections from the edges of the bottom, middle and top electrodes 53, 56 and 59 some of the reflected waves may suppress each other, which can eliminate some spurious lateral modes. Moreover, the amount of reflected wave suppression can be increased by modifying the alignment of the electrode edges as in the embodiments of FIGS. 6 through 9, for example. As will be explained with reference to FIGS. 6 through 9, different alignments can have different effects, such increasing Rp or increasing $kt^2$. This can be used to create different types of DBARs for different applications.

Figure 6:
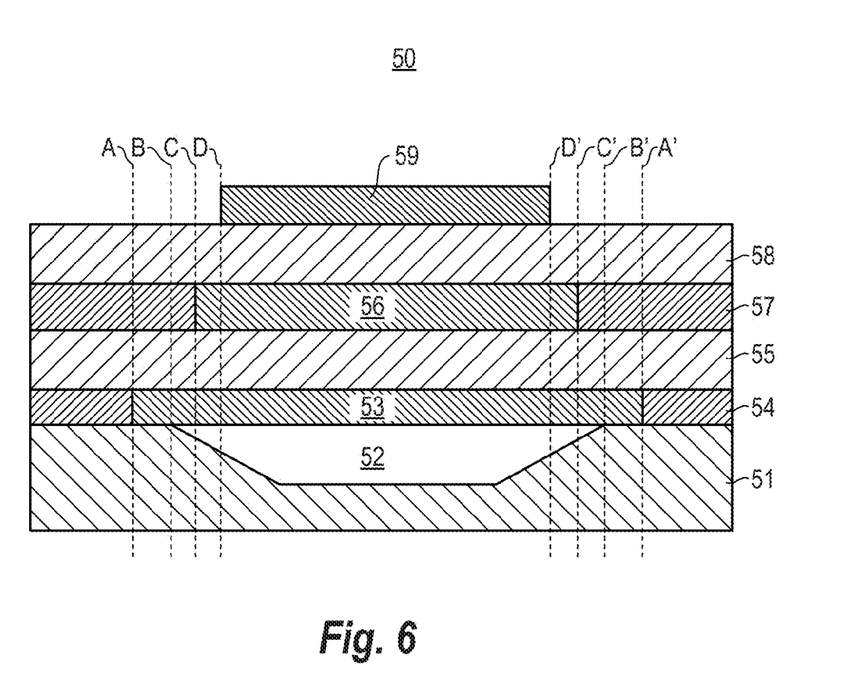
FIG. 6 is a cross-sectional view of a DBAR having electrode edges that are aligned in a Δ (Delta, or "pyramid") configuration according to an example embodiment.

FIG. 6 is a cross-sectional view of DBAR 50 with electrode edges that are aligned in a "Δ" (or "pyramid") configuration according to an example embodiment. This embodiment is similar to DBAR 50 of FIG. 5, except that the relative lengths of bottom, middle and top electrodes 53, 56, and 59, as well first and second planarization layers 54 and 57, have been modified to achieve the Δ configuration. The Δ configuration tends to increase the parallel resistance Rp of DBAR 50 compared with the configuration of FIG. 5. However, the Δ configuration tends to have relatively low $kt^2$.

Referring to FIG. 6, bottom electrode 53 has edges that extend beyond the boundaries of trench 52 and the edges of middle electrode 56, and middle electrode 53 has edges that are confined within the boundaries of trench 52 and extend beyond the edges of top electrode 59. In addition, bottom, middle and top electrodes 53, 56, and 59 are substantially aligned about a center axis such that these electrodes, with their decreasing widths, form a Δ configuration.

In the embodiment of FIG. 6, edges of bottom, middle and top electrodes 53, 56, and 59 can be separated from each other by a distance of approximately 2 microns while the width of trench 52 is approximately 200 microns. In alternative embodiments, these distances, as well as the relative size differences between different features, can be variously modified.

The Δ configuration has been demonstrated to increase parallel resistance Rp by approximately 25-50% in certain embodiments. For example, it has been experimentally shown to increase Rp from approximately 2K ohms to approximately 2.5K-3.0K ohms. Moreover, this improvement can be achieved without significantly affecting the manufacturing cost of a DBAR because it merely requires a change in the relative alignments of the electrodes.

Figure 7:
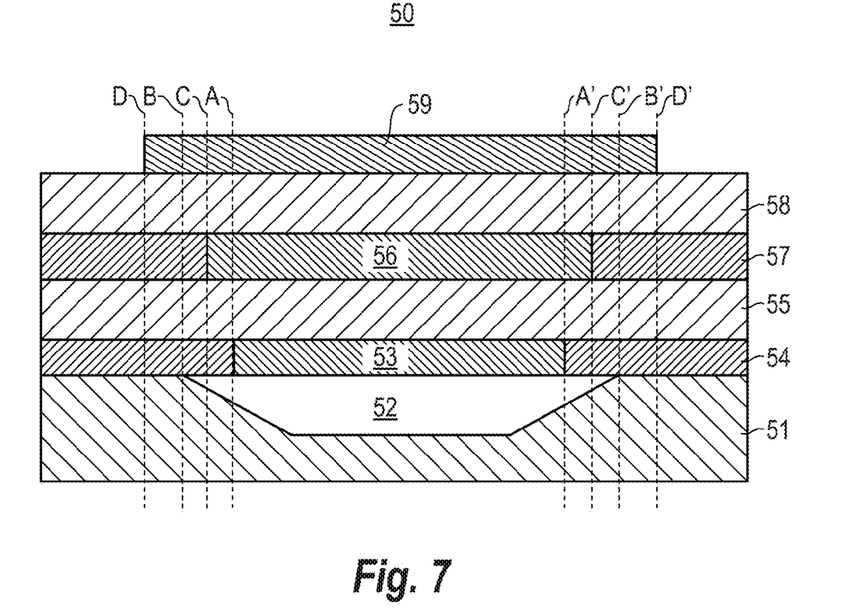
FIG. 7 is a cross-sectional view of a DBAR having electrode edges that are aligned in a ∇ (Nabla, or "inverse pyramid") configuration according to an example embodiment.

FIG. 7 is a cross-sectional view of DBAR 50 with electrode edges that are aligned in an "∇" (or "inverse pyramid") configuration according to an example embodiment. This embodiment is similar to DBAR 50 of FIG. 6, except that that the relative widths of the electrodes are inverted so that bottom electrode 53 is the narrowest electrode and top electrode 59 is the widest electrode. Like the Δ configuration of FIG. 6, the ∇ configuration also tends to improve the parallel resistance Rp of DBAR 50 compared with the configuration of FIG. 5, but it also tends to have relatively low $kt^2$.

Figure 8:
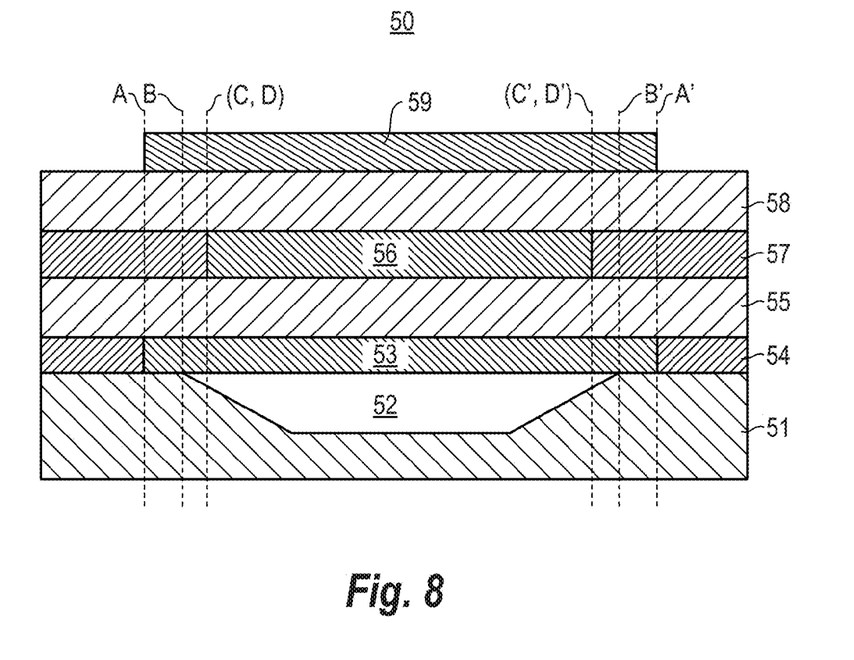
FIG. 8 is a cross-sectional view of a DBAR having electrode edges that are aligned in an "Ξ" (Xi, or "cut-in") configuration according to an example embodiment.

FIG. 8 is a cross-sectional view of DBAR 50 with electrode edges that are aligned in a "Ξ" (Xi or "cut-in") configuration according to an example embodiment. This embodiment modifies the electrode widths of DBAR 50 so that the edges of middle electrode 56 are inside the edges of both bottom electrode 53 and top electrode 59.

In FIG. 8, bottom and top electrodes 53 and 59 are shown with their edges aligned with each other. However, the Ξ configuration does not necessarily have aligned top and bottom electrodes.

In contrast to the Δ and ∇ configurations, the Ξ configuration tends to increase the electromechanical coupling coefficient $kt^2$ compared with the embodiment of FIG. 5. However, it also tends to have relatively low parallel resistance Rp. Accordingly, this configuration can be beneficially used in applications that require relatively high $kt^2$, but are also able to tolerate lower Rp.

Figure 9:
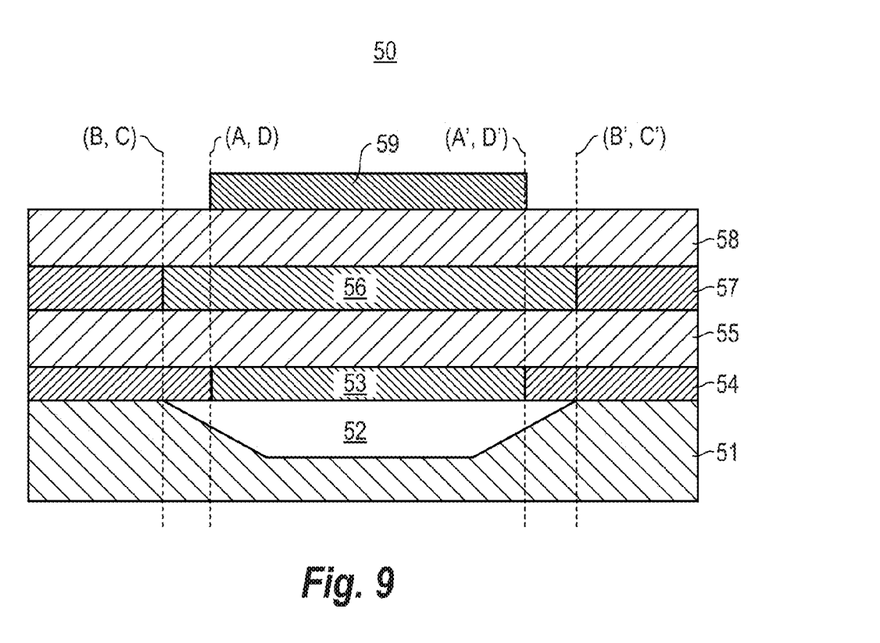
FIG. 9 is a cross-sectional view of a DBAR having electrode edges that are aligned in a "Θ" (Theta, or "cut-out") configuration according to an example embodiment.

FIG. 9 is a cross-sectional view of DBAR 50 with electrode edges that are aligned in a "Θ"(or "cut-out") configuration according to an example embodiment. The Θ configuration can be viewed as an inverse of the Ξ configuration. In other words, rather than forming middle electrode 56 with its edges inside the edges of both bottom electrode 53 and top electrode 59, middle electrode 56 is formed with its edges outside the edges of both bottom electrode 53 and top electrode 59. Like the Ξ configuration, the Θ configuration also tends to increase $kt^2$ at the expense of Rp. Accordingly, this configuration can also be beneficially used in applications that require relatively high $kt^2$, but are also able to tolerate lower Rp.

Figure 10:
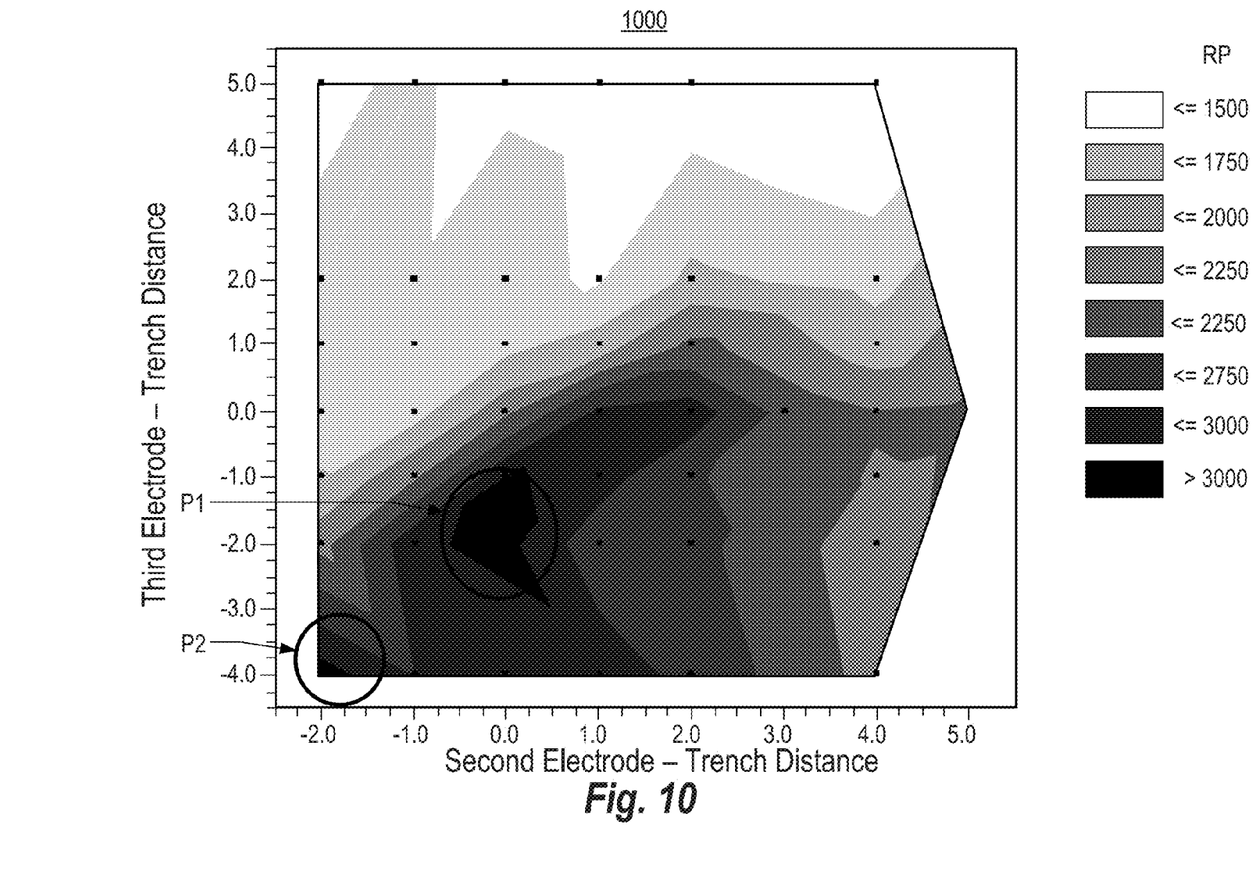
FIG. 10 is a graph illustrating a measured parallel resistance Rp of a DBAR as a function of alignment between a middle electrode and a trench, and alignment between a top electrode and the trench.
Figure 11:
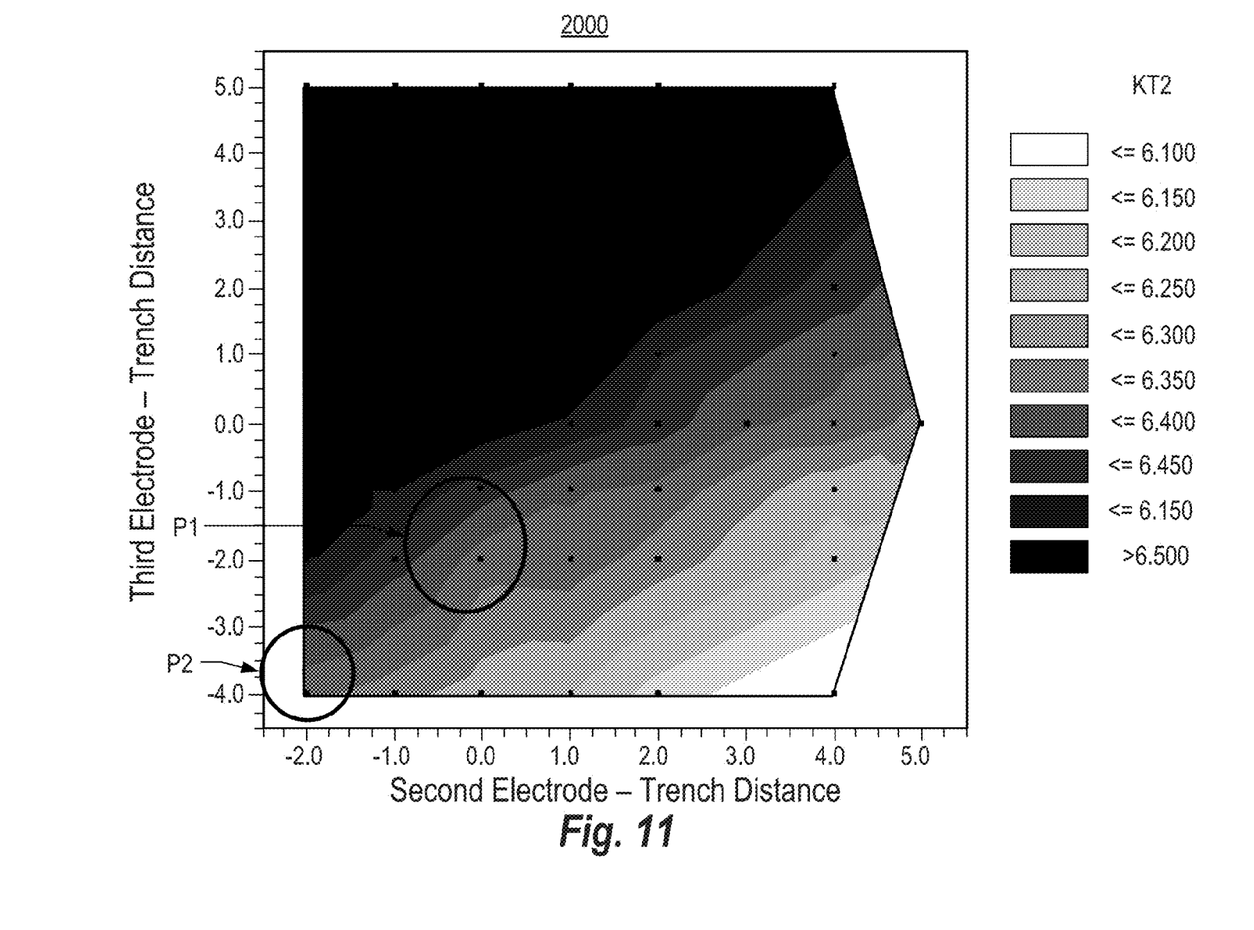
FIG. 11 is a graph illustrating a measured electromechanical coupling coefficient $kt^2$ of a DBAR as a function of alignment between a middle electrode and a trench, and alignment between a top electrode and the trench.

FIG. 10 is a graph illustrating a measured parallel resistance Rp of a DBAR as a function of alignment between a middle electrode and a trench, and alignment between a top electrode and the trench. FIG. 11 is a graph illustrating a measured electromechanical coupling coefficient $kt^2$ of a DBAR as a function of alignment between a middle electrode and a trench, and alignment between a top electrode and the trench. In general, an optimal configuration of the electrode edges of a DBAR can be determined by varying their relative alignments as shown in the graphs of FIGS. 10 and 11, and then choosing a configuration that achieves desired values of Rp and/or $kt^2$. Such a configuration can be found experimentally as shown in FIGS. 10 and 11. Alternatively, these alignment effects may be simulated numerically to provide initial information for final experimental optimization.

The data shown in FIGS. 10 and 11 was measured from DBARs designed to operate in a relatively low frequency band, such as 800 megahertz to 900 megahertz. The DBAR had a trench with a cross sectional width of approximately 200 microns. For explanation purposes, the standard DBAR will be assumed to have the form of DBAR 50 of FIG. 5. More specifically, it will be assumed that the data was generated by varying the distance of the edges of middle and top electrodes 56 and 59 from the boundaries of trench 52.

In FIGS. 10 and 11, the x-axis indicates a distance between the edges of middle electrode 56 and the boundaries of trench 52, and the y-axis indicates a distance between the edges of top electrode 59 and the boundaries of trench 52. It is assumed that bottom electrode 53 extends across trench 52 and overlaps with substrate 51 on both sides of the trench by approximately 2 μm to approximately 5 μm, depending on the size of the device.

The values on the x-axis range from −2 microns to +5 microns, with negative numbers indicating that middle electrode 56 is located inside the boundaries of trench 52, and positive numbers indicating that middle electrode is located outside the boundaries of trench 52. For example, a point located in a circle labeled "P1" corresponds to the Δ configuration in which the edges of middle electrode 56 are located at a distance of zero microns from the boundaries of trench 52, and the edges of top electrode 59 are located at a distance of 2 microns inside the boundaries of trench 52.

Referring to FIG. 10, the values of Rp range from less than 1500 ohms to greater than 3000 ohms, as indicated by the legend at the right side of the graph. The highest values of Rp (i.e., local maxima) are located in a region at the circle labeled "P1", which corresponds to the Δ configuration shown in FIG. 6, and the lowest values of Rp (i.e., local minima) are located in a region at the top of the graph, which corresponds to the Ξ configuration shown in FIG. 8. Similarly, high Rp values greater than 3000 ohms are located at the circle labeled "P2" and correspond to another Δ configuration where the edges of middle electrode 56 are located at a distance of 2 microns from the boundaries of trench 52, and the edges of top electrode 59 are located at a distance of 4 microns inside the boundaries of trench 52. These results indicate that electrode alignment in DBARs can be used as an effective tool to suppress unwanted lateral modes and beneficially increase Rp in these devices.

Referring to FIG. 11, the values of $kt^2$ range from less than 6.1% to greater than 6.5%, as indicated by the legend at the right side of the graph. The highest values of $kt^2$ are located in a region at the top of the graph, which corresponds to the Ξ configuration of FIG. 8, and the lowest values of $kt^2$ are located in a region at the bottom left of the graph, which corresponds to the Δ configuration of FIG. 6. As indicated by the circles labeled "P1", and "P2" the configurations that produce a superior Rp, as shown in FIG. 10 produces somewhat inferior $kt^2$, as shown in FIG. 11. Moreover, an arbitrary selection of electrode alignments without a regard to the present teachings may result in devices with inferior both Rp and $kt^2$ values, as it may be appreciated from FIGS. 10 and 11 for one of ordinary skill in the art.

Although not shown in the figures, additional features can be included in DBAR 50 to improve Rp or $kt^2$. For example, air bridges can be formed at the edges of the electrodes and/or the thicknesses of the electrodes and piezoelectric layers can be optimized to reduce spurious modes.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. An acoustic resonator, comprising:
a substrate having a trench with lateral boundaries;
a first electrode formed on the substrate over the trench and having lateral edges that are laterally offset from the lateral boundaries of the trench by a first distance;
a first piezoelectric layer formed on the first electrode;
a second electrode formed on the first piezoelectric layer and having edges that are laterally aligned inside the lateral boundaries of the trench;
a second piezoelectric layer located on the second electrode; and
a third electrode located on the second piezoelectric layer and having edges that are laterally offset from the edges of the second electrode by a second distance, wherein the first, second, and third electrodes have lateral edges defining one of a Δ configuration, a ∇ configuration, or a Ξ configuration.

2. The acoustic resonator of claim 1, wherein the edges of the first electrode are laterally aligned outside lateral boundaries of the trench.

3. The acoustic resonator of claim 1, wherein the second distance is greater than or equal to approximately 0.5% of a width of the trench.

4. The acoustic resonator of claim 1, wherein the second distance is approximately 2 microns and the width of the trench is approximately 200 microns.

5. The acoustic resonator of claim 1, wherein the first and second distances are between 0.5 microns and 5 microns.

6. The acoustic resonator of claim 1, wherein the lateral edges define a Ξ configuration, and the lateral edges of the first and third electrodes are aligned with each other.

7. The acoustic resonator of claim 1, further comprising a first planarization layer formed adjacent to the first electrode, and a second planarization layer formed adjacent to the second electrode.

8. The acoustic resonator of claim 1, wherein the trench comprises an air gap or an acoustic reflector.

9. The acoustic resonator of claim 1, further comprising a first terminal connected to the first and third electrodes, and a second terminal connected to the second terminal, wherein the first and second terminals are configured to apply an electrical field across the first and second piezoelectric layers to operate the acoustic resonator.

10. The acoustic resonator of claim 1, wherein the first and second distances are chosen to provide the acoustic resonator with a local maximum value of parallel resistance or electromechanical coupling coefficient.

11. The acoustic resonator of claim 1, wherein the edges of the first electrode are laterally aligned outside lateral boundaries of the trench.

12. The acoustic resonator of claim 1, wherein the edges of the third electrode are located inside of the edges of the second electrode.

13. The acoustic resonator of claim 1, wherein the edges of the third electrode are located outside the edges of the second electrode.

14. The acoustic resonator of claim 1, wherein the second distance approximately 0.5% to approximately 1.0% of the width of the trench.

15. A device, comprising:
a first terminal;
a first acoustic resonator comprising a first electrode, a second electrode, and a first piezoelectric layer extending between the first and second electrodes;
a second acoustic resonator comprising the second electrode, a third electrode, and a second piezoelectric layer extending between the second and third electrodes; and
a second terminal,
wherein the first terminal is connected to the first and third electrodes and the second terminal is connected to the second electrode such that the first and second acoustic resonators are configured to operate in parallel with each other, and
wherein the first through third electrodes each have lateral edges that are offset from lateral edges of the other electrodes and the first, second, and third electrodes have lateral edges defining one of a Δ configuration, a ∇ configuration, or a Ξ configuration.

16. The device of claim 15, wherein the first through third electrodes each have lateral edges that are offset from lateral edges of the other electrodes by an amount greater than or equal to approximately 0.5% of their respective widths.

17. The device of claim 15, further comprising a substrate having a trench with lateral boundaries formed below the first electrode, wherein the lateral edges of the first electrode are located outside the lateral boundaries of the trench, and the lateral edges of the second electrode are located inside the lateral boundaries of the trench.

18. The device of claim 17, wherein the lateral edges of the second and third electrodes are offset from each other by approximately 0.5-4 microns and the trench has a width of approximately 100-200 microns.

19. An acoustic resonator, comprising:
a substrate having a trench with lateral boundaries;
a first electrode formed on the substrate over the trench and having lateral edges that are laterally offset from the lateral boundaries of the trench by a first distance;
a first piezoelectric layer formed on the first electrode;
a second electrode formed on the first piezoelectric layer and having edges that are laterally aligned inside the lateral boundaries of the trench;
a second piezoelectric layer located on the second electrode; and
a third electrode located on the second piezoelectric layer and having edges that are laterally offset from the edges of the second electrode by a second distance greater than or equal to approximately 0.5% of a width of the trench.

* * * * *